US012363860B2

(12) United States Patent
Mann et al.

(10) Patent No.: US 12,363,860 B2
(45) Date of Patent: Jul. 15, 2025

(54) ISOLATING TEMPERATURE FLUCTUATION IN AN ELECTRONICS ENCLOSURE

(71) Applicant: International Business Machines Corporation, Armonk, NY (US)

(72) Inventors: Phillip V. Mann, Rochester, MN (US); Christopher M. Marroquin, Rochester, MN (US); Ray Clement Laning, Paynesville, MN (US); Milnes P. David, New Paltz, NY (US); Nathan Lee Dunfee, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 244 days.

(21) Appl. No.: 18/300,755

(22) Filed: Apr. 14, 2023

(65) Prior Publication Data

US 2024/0349448 A1    Oct. 17, 2024

(51) Int. Cl.
*H05K 7/20*    (2006.01)

(52) U.S. Cl.
CPC ..... *H05K 7/20272* (2013.01); *H05K 7/20636* (2013.01)

(58) Field of Classification Search
CPC ............ H05K 7/20272; H05K 7/20636; H01L 23/473
See application file for complete search history.

(56) References Cited

U.S. PATENT DOCUMENTS

| 5,703,536 A * | 12/1997 | Davis ................. H05K 7/20927 330/289 |
| 8,004,841 B2 * | 8/2011 | Cipolla ............... F28D 15/0233 174/15.1 |
| 8,289,701 B2 | 10/2012 | Suzuki et al. |
| 9,245,821 B2 | 1/2016 | Gohara et al. |
| 10,123,453 B2 | 11/2018 | Saito |
| 11,157,050 B1 * | 10/2021 | Lunsman ........... H05K 7/20509 |
| 11,363,738 B2 * | 6/2022 | Thompson ......... H05K 7/20272 |
| 11,925,005 B2 * | 3/2024 | Fowler ............... H05K 7/20563 |
| 2004/0042174 A1 | 3/2004 | Tomioka et al. |
| 2020/0100388 A1 * | 3/2020 | Hernandez-Toledo ...................... H05K 7/20636 |
| 2022/0256737 A1 | 8/2022 | Huang |

FOREIGN PATENT DOCUMENTS

| CN | 114649284 A | 6/2022 |
| CN | 217655958 U | 10/2022 |
| JP | 2005197454 A | 7/2005 |
| KR | 20200124444 A | 11/2020 |
| KR | 20210087802 A | 7/2021 |

\* cited by examiner

*Primary Examiner* — Zachary Pape
(74) *Attorney, Agent, or Firm* — Patterson + Sheridan, LLP

(57) ABSTRACT

Embodiments of the disclosure provide cooling systems and cooling methods for isolating temperature fluctuation in an electronics enclosure. Embodiments of the disclosure provide effective cooling of high power temperature fluctuating components and a stable reference temperature for temperature sensitive components included in a single electronics enclosure. A disclosed multiple path cooling system includes a first path for cooling power variable components and a second path to maintain stable temperature cooling for temperature sensitive components.

20 Claims, 5 Drawing Sheets

500

- COMPUTER 501
  - PROCESSOR SET 510
    - PROCESSING CIRCUITRY 520
    - CACHE 521
  - COMMUNICATION FABRIC 511
  - VOLATILE MEMORY 512
  - PERSISTENT STORAGE 513
    - OPERATING SYSTEM 522
    - 580
      - COOLING-FLOW CONTROL 582
      - COOLING-FLOW PARAMETER DATA STORE 584
  - PERIPHERAL DEVICE SET 514
    - UI DEVICE SET 523
    - STORAGE 524
    - IoT SENSOR SET 525
  - NETWORK MODULE 515

- END USER DEVICE 503
- REMOTE SERVER 504
  - REMOTE DATABASE 530
- PRIVATE CLOUD 506
- WAN 502
- GATEWAY 540
- PUBLIC CLOUD 505
  - CLOUD ORCHESTRATION MODULE 541
  - HOST PHYSICAL MACHINE SET 542
  - VIRTUAL MACHINE SET 543
  - CONTAINER SET 544

FIG. 5

ISOLATING TEMPERATURE FLUCTUATION IN AN ELECTRONICS ENCLOSURE

BACKGROUND

The present invention relates to the electronics cooling field and more specifically, to systems and methods for implementing electronics cooling with defined cooling paths for isolating temperature fluctuation in an electronics enclosure.

Traditional systems for air-cooled and water-cooled electronics have thermal limits in place to protect and maintain the function and reliability of the components being cooled. In existing electronics systems airflow can be manipulated to keep components below a temperature threshold in order to maintain optimum function. In existing water-cooled systems optimal flow rates and water temperature can be manipulated to provide the temperature below the threshold temperature.

While existing cooling systems can effectively maintain the temperature of components below their respective limits, the existing cooling systems are generally not concerned with maintaining stable temperatures for the components (i.e., maintaining temperatures of the components that do not substantially vary or fluctuate). Stable temperatures are rarely necessary in traditional electronics enclosures since there is no noticeable performance penalty for components near their thermal limit or significantly cooler than their thermal limit. Performance of many components can improve when the components are cooler, which is the reason some cooling systems are built with water-cooling to provide improved cooling capacity.

In state-of-the-art Radio Frequency (RF) electronics however performance in not improved with cooler temperatures. RF electronics are very temperature dependent, that is performance and responses change significantly as temperature changes. RF electronics require new cooling techniques, particularly when the RF components are located with other traditional high power electronic component within a single enclosure. While higher performing cooling can be used to minimize cooling issues in some electronics drawers, new techniques are needed for RF components. In general, new cooling techniques are needed to effectively isolate temperature sensitive components from other heat dissipative components and isolate selected components from temperature fluctuations to provide temperature stability of the selected components.

In the following description and claims, water-cooling is used only as an illustrative example, it should be understood that the disclosed embodiments are not limited to water-cooled systems. The disclosed embodiments advantageously can implement different liquid-cooled systems, with various liquids including water, propylene glycol, mineral oil, refrigerant, alcohol, and other Engineered Cooling Fluids with various special blends used for cooling applications in a given liquid-cooled system.

SUMMARY

Embodiments of the disclosure provide cooling systems and cooling methods for isolating temperature fluctuation in an electronics enclosure. Embodiments of the disclosure provide effective cooling of high power temperature fluctuating components and a stable reference temperature for temperature sensitive components.

In a disclosed non-limiting embodiment, a cooling system in an electronics enclosure comprises a first cooling path for cooling first power fluctuating components and a second cooling path for cooling second temperature stable components. The first cooling path comprises a first rail defining a first water-cooling flow from a water-flow inlet to a water-flow outlet of the cooling system. A first cooling-interface assembly engages the first rail and has a selected configuration to engage and cool the first power fluctuating components. The second cooling path comprises a second rail defining a second water-cooling flow from the water-flow inlet to the water-flow outlet of the cooling system. A second cooling-interface assembly engages the second rail and has a selected configuration to cool the second temperature stable components.

Other disclosed embodiments include methods for isolating temperature fluctuation in an electronics enclosure, implementing features of the above-disclosed cooling system.

BRIEF DESCRIPTION OF THE DRAWINGS

FIG. 5 is a block diagram of an example computer environment for use in conjunction with one or more disclosed embodiments for isolating temperature fluctuation the example multiple path water-cooling system in the electronics enclosure.

DETAILED DESCRIPTION

Figure 1:
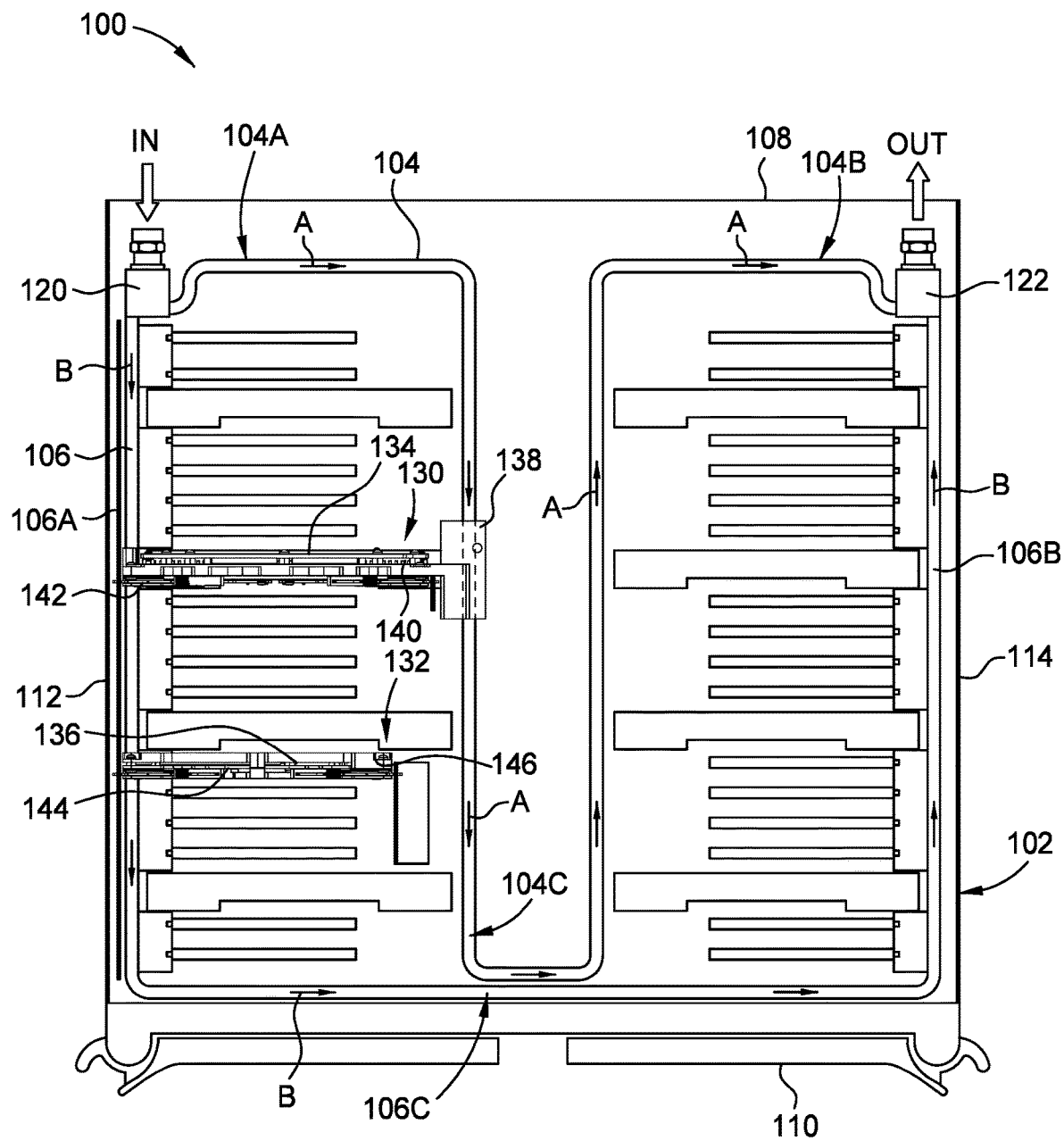
FIG. 1 is a top view illustrating an example multiple path water-cooling system for isolating temperature fluctuation in an electronics enclosure of one or more disclosed embodiments.

Embodiments of the disclosure provide cooling systems and cooling methods for isolating temperature fluctuation in an electronics enclosure. In an electronics enclosure or drawer filled with power fluctuating components, certain components, such as RF components require minimal temperature shifts or generally stable temperature to perform optimally. In a disclosed embodiment, a multiple path cooling system includes a path for cooling power variable components and another separate and independent path for stable temperature cooling temperature of sensitive components. In one embodiment, a first water-cooling rail and a second water-cooling rail provide separate and independent water-cooling flows. The first water-cooling rail and the second water-cooling rail are configured with a respective cooling-interface assembly for cooling the respective power variable components and the temperature sensitive components. The electronics enclosure may include a dense array of pluggable electronic cards with some cards including power variable components (e.g., high power traditional electronics) and other cards including temperature sensitive components (e.g., highly sensitive RF electronics). The multiple path cooling system is configured to provide effective cooling performance for both types of pluggable electronic cards installed in a single electronics enclosure. In a disclosed embodiment, the first cooling rail is arranged to provide stable and highly conductive, convective cooling for high power devices, and the second water-cooling rail is arranged to provide a very stable reference temperature for thermally sensitive devices (e.g., for RF devices).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Disclosed systems and methods provide separate cooling flow paths to isolate temperature fluctuations of power variable components from temperature sensitive components in an electronics enclosure. Disclosed embodiments provide effective cooling of high power temperature fluctuating components and a stable reference temperature for temperature sensitive components in a single electronics enclosure or drawer.

Figure 2:
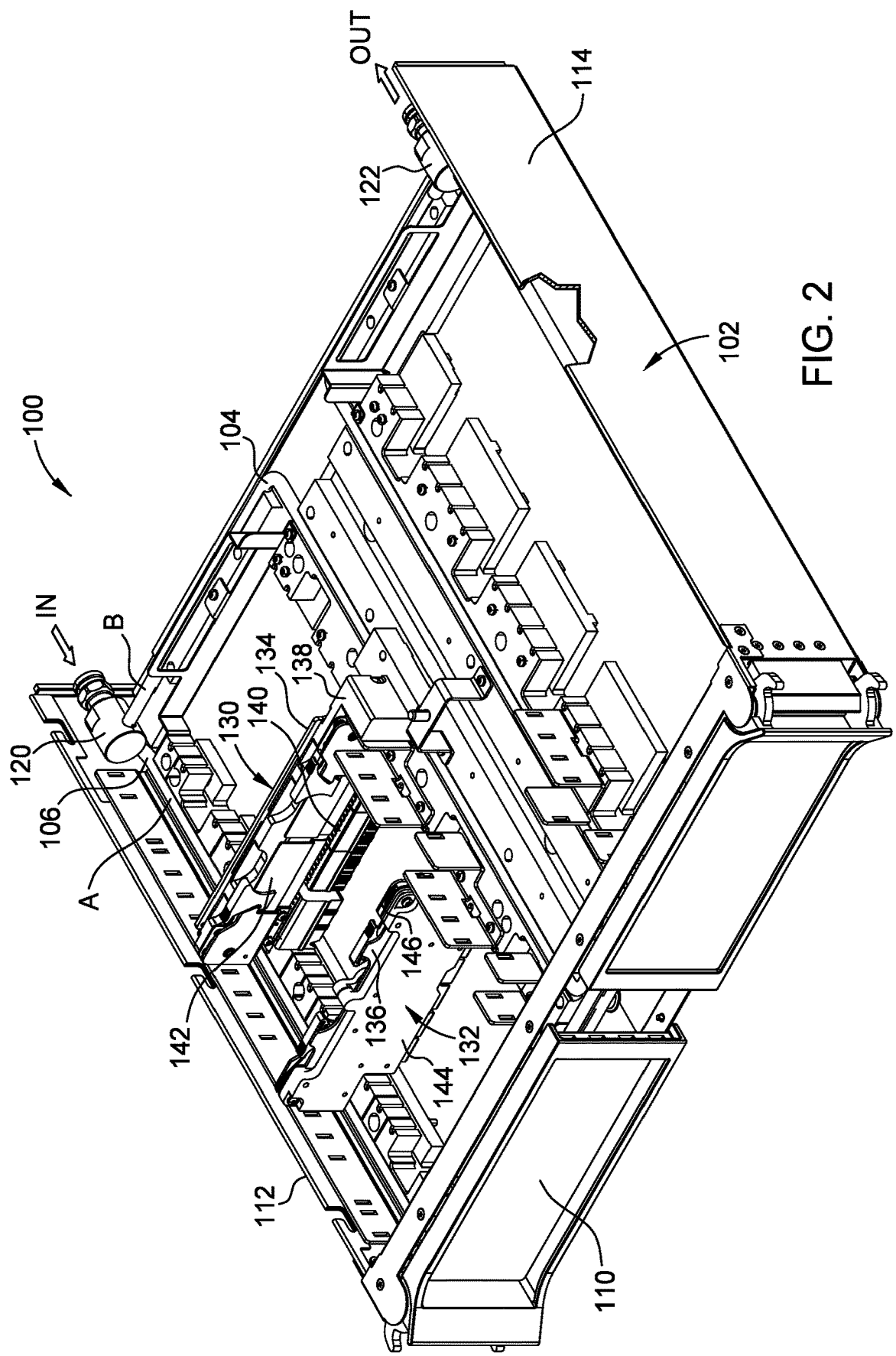
FIG. 2 is a perspective view of the example multiple path water-cooling system in the electronics enclosure of FIG. 1 of one or more disclosed embodiments.

Referring to FIGS. 1 and 2, an illustrated example liquid-cooled system 100, for example a water-cooling system 100 providing temperature fluctuation isolation in an electronics enclosure 102 of one or more disclosed embodiments. FIG. 1 is a top plan view and FIG. 2 is a perspective view of the example cooling system 100. The cooling system 100 is a multiple path water-cooling system configured to provide effective cooling performance for two types of pluggable electronic cards installed in a given electronics enclosure 102. Multiple types of pluggable electronic cards (e.g., two types of printed circuit cards including either power variable components or temperature sensitive components) can be installed in the enclosure 102. In a disclosed embodiment, a first water-cooled rail 104 is arranged to provide highly conductive, convective cooling for high power devices, and a second water-cooling rail 106 is arranged to provide a stable reference temperature cooling for thermally sensitive devices (e.g., for RF devices).

The cooling system 100 includes the first rail 104 defining a first cooling path A (e.g., indicated by arrows labeled A) for cooling first power fluctuating components and the second rail 106 defining a second cooling path B (e.g., indicated by arrows labeled B) for cooling second temperature stable components, such as sensitive RF components. As shown, the first cooling path A and the second cooling path B are separate, spaced-apart, independent cooling paths, providing separate and independent water-cooling flows respectively defined by the rails 104 and 106. The first rail 104 is a unitary water conduit or pipe providing the first cooling path A. Similarly, the second rail 106 is a unitary water conduit or pipe providing the second cooling path B. For example, the first rail 104 and the second rail 106 are formed of a highly thermal conductive metal material, such as Copper (Cu), and can have an identical size.

As shown, the first rail 104 includes first end rail sections or portions 104A and 104B extending near an end 108 of the enclosure 102. A middle rail portion 104C of the first rail 104 connecting the first end rail portions 104A and 104B has an elongated, generally narrow U-shape extending from near the enclosure end 108 to near an opposite end 110 of the enclosure 102. The second rail 106 has an overall generally wide U-shape including parallel side rail portions 106A and 106B extending near respective sides 112, 114 of the enclosure 102. A rail portion 106C connecting of the parallel side rail portions 106A and 106B of the second rail 106 extends near the enclosure end 110. The configurations of the cooling rails 104 and 106 provide illustrative examples, while various other configurations could be used to provide the separate and independent cooling paths A and B of disclosed embodiments.

In cooling system 100, the first rail 104 defines the cooling path A of a first water-cooling flow from an inlet cooling flow control valve rail-splitter 120 that receives a water-flow inlet IN (e.g., indicated by arrow labeled IN) to an outlet cooling rail-splitter 122 with a water-flow outlet OUT (e.g., indicated by an arrow labeled OUT). The second rail 106 defining the cooling path B provides a reduced second water-cooling flow (e.g., as compared to the water-cooling flow of path A) from the water-flow inlet IN of inlet cooling rail-splitter 120 to the water-flow outlet OUT of the outlet cooling rail-splitter 122.

In a disclosed embodiment, the inlet cooling flow control valve rail-splitter 120 has different orifice sizes connected to the rails 104 and 106, to restrict cooling water flow of path B to the cooling rail 106, relative to path A of the cooling rail 104. The cooling flow control valve rail-splitter 120 In a disclosed embodiment, the inlet flow control valve rail-splitter 120 can provide a limited water-flow (e.g., RF water-flow choke) for the cooling flow B of the cooling rail 106, that cools temperature sensitive components (e.g., RF components). Such RF water-flow choke or limited water-flow to the cooling rail 106 helps improve cooling of the power fluctuating components with the cooling flow path A of the cooling rail 104.

In a disclosed embodiment, the inlet flow control valve rail-splitter 120 for example can be automatically controlled based on operating temperature to dynamically change cooling water-flows into the cooling system 100. For example, the control valve of the cooling flow control valve rail-splitter 120 can be programmatically controlled to dynamically change the flow impedance through each path A and path B based on operating temperatures. The outlet cooling rail-splitter 122 can be implemented without providing a control valve in this fitting.

In a disclosed embodiment, the cooling system 100 includes a first cooling-interface assembly 130 that engages the first rail 104 and has a first selected configuration to engage and cool the power fluctuating components of a first circuit board 134. As shown, a second cooling-interface cooling assembly 132 that engages the second rail 106 and has a second selected configuration to cool the second temperature stable components of a second circuit board 136.

In a disclosed embodiment, the first cooling-interface assembly 130 provided with circuit board 134 carrying high power fluctuating components includes a T-shaped heat spreader member 138 configured with an elongated portion for cooling engagement with the circuit board 134 and a single attach point at a T head of the heat spreader for attachment to the first rail 104. A Thermal Interface Material (TIM) can be provided between the T-shaped heat spreader member 138 and high power circuit board 134. The first cooling-interface assembly 130 includes a support member 140 supporting and positioning the high power circuit board 134 with the T-shaped heat spreader member 138. The first cooling-interface assembly 130 can include a cooling assembly latching member 142 attached to the cooling T-shaped heat spreader member 138 and support member 140. In a disclosed embodiment, the T-shaped heat spreader member 138 can be implemented by one of a cast and formed thermally conductive member or an extruded and machined thermally conductive member having a geometry to effectively cool a high heat load of the high power circuit board 134. For example, the first rail 104 together with the first cooling-interface assembly 130 may have a cooling capacity in a range of 20 to 60 Watts. In a disclosed embodiment, the first rail 104 together with the first cooling-interface assembly 130 provide effective and stable cooling of the first power fluctuating components of the high power circuit board 134.

Figure 3:
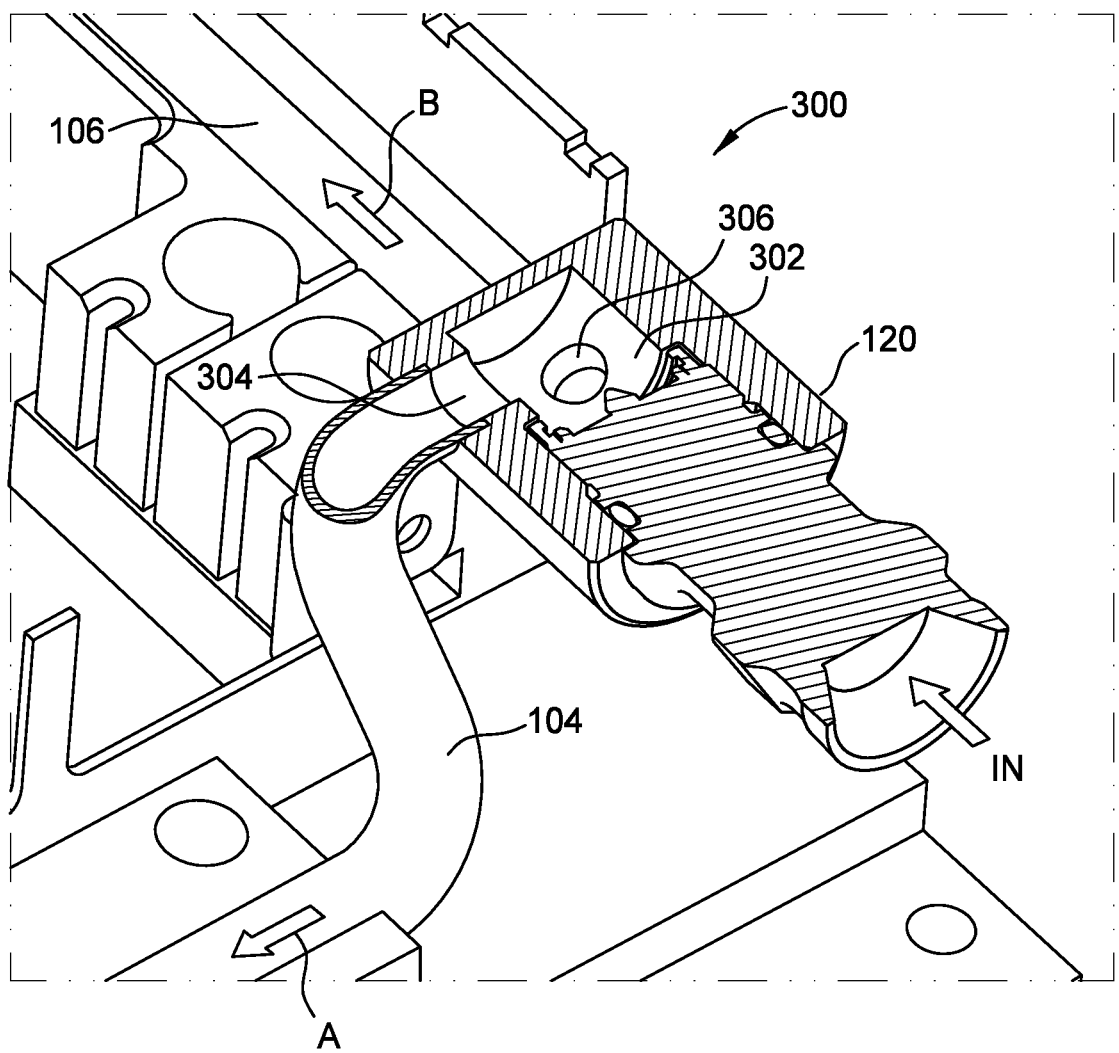
FIG. 3 is a detail, perspective, cross-sectional view of a cooling rail-splitter flow valve of the example multiple path water-cooling system of FIGS. 1 and 2 of one or more disclosed embodiments.

In a disclosed embodiment, the second cooling-interface assembly 132 provided with the second cooling rail 106 includes a pair of heat spreader members 144, 146 arranged for cooling the RF temperature sensitive components of the circuit board 136. The second cooling-interface assembly 132 includes the respective heat spreader members 144, 146 disposed on opposite sides of the circuit board 136 and mounted to the second cooling rail 106 in cooling engagement with the circuit board. The heat spreader members 144, 146 provide electrical RF shielding and cooling of the circuit board 136. In a disclosed embodiment, each heat spreader member 144, 146 can be implemented with a stamped and formed member, or a cast member formed of a high thermal conductive material such as Aluminum (Al). The second cooling rail 106 with the cooling-interface assembly 132 cooling of circuit board 136, can maintain power fluctuation for example less than 0.25 Watt for the RF temperature sensitive components. In a disclosed embodiment, the cooling-interface assembly 132 and heat spreader 144 can provide effective and stable cooling, maintaining a stable temperature to substantially insulate the second temperature stable components (e.g., sensitive RF components) carried by circuit board 136 from temperature fluctuation, FIG. 3 illustrates an example cooling flow control valve rail-splitter 300 of cooling system 100 that can implement the inlet cooling flow control valve rail-splitter 120 of disclosed embodiments. FIG. 3 provides a detail, perspective, cross-sectional view of the example cooling flow control valve rail-splitter 300. As shown, the rail-splitter 300 has different orifice sizes 304 and 306 for connections to the rails 104 and 106 as indicated in a rail-splitter body portion 302. The orifice 306 to the cooling rail 106 is smaller than the orifice 304 to the cooling rail 104, providing a reduced water-cooling flow B (e.g., the RF reduced water-cooling flow or RF water-cooling choke) for the cooling rail 106.

Figure 4:
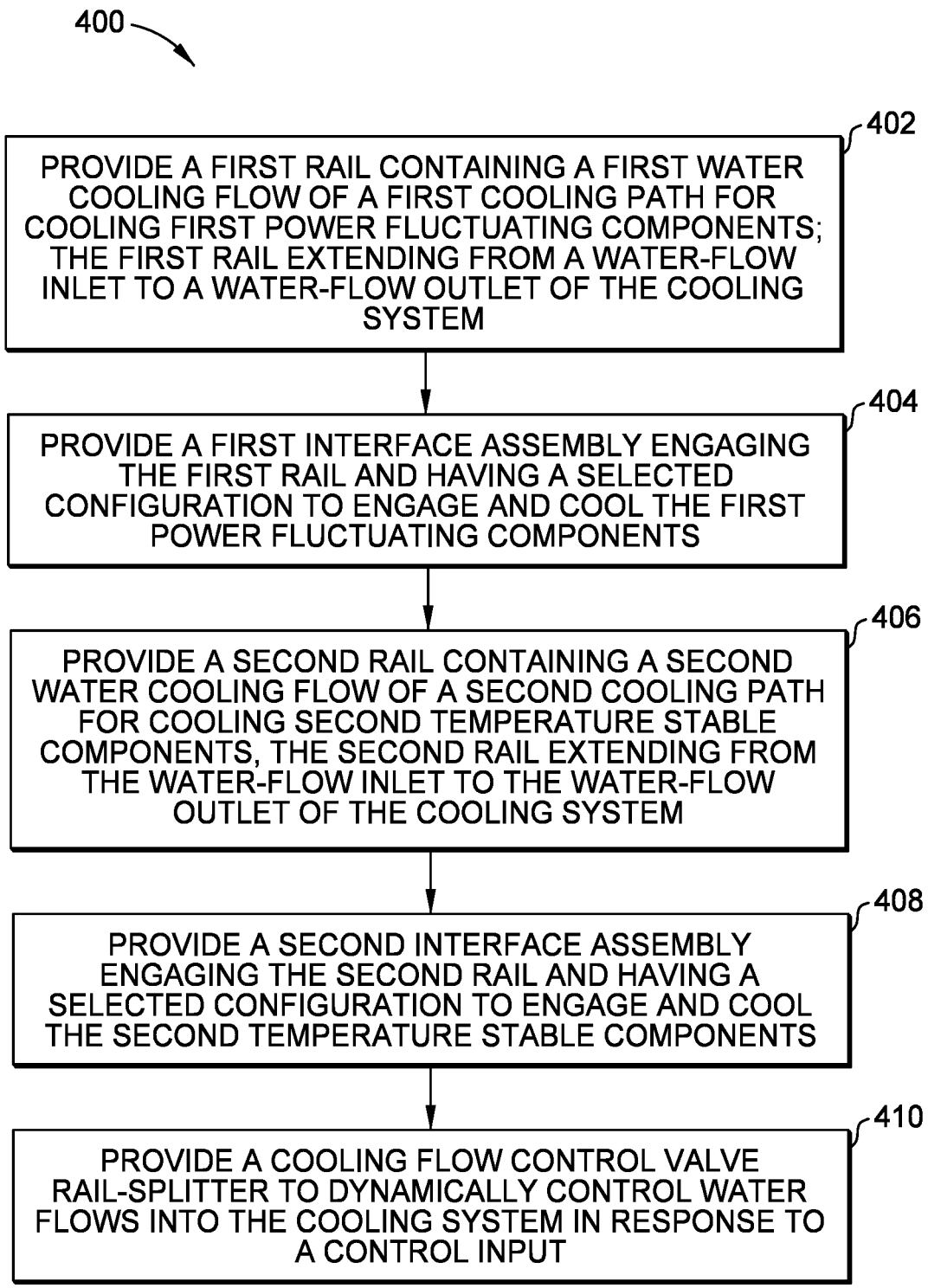
FIG. 4 is a flow chart of an example cooling method for isolating temperature fluctuation the example multiple path water-cooling system in the electronics enclosure of FIG. 1 of one or more disclosed embodiments.

FIG. 4 illustrates an example cooling method 400 for isolating temperature fluctuation, for example with the example multiple path water-cooling system 100 in the electronics enclosure 102 of one or more disclosed embodiments. Referring also to FIG. 5, a computing environment 500 includes a computer 501, a Cooling Flow Control 582, and a Cooling-Flow Parameter Data Store 584 that can be used in conjunction with the cooling system 100 for implementing for isolating temperature fluctuation isolation of one or more disclosed embodiments. In a disclosed embodiment, the computer 501 together with the Cooling Flow Control 582 and the Cooling-Flow Parameter Data Store 584 can programmatically control the inlet cooling flow control valve rail-splitter 120, for example to dynamically change the flow impedance through the flow path A and the flow path B based on operating temperatures.

As indicated at block 402, a first rail containing a first water-cooling flow of a first cooling path provides cooling for first power fluctuating components. The first rail extends from a water-flow inlet to a water-flow outlet of the cooling system.

As indicated at block 404, a first interface assembly engages the first rail and has a selected configuration to engage and cool the first power fluctuating components. As indicated at block 406, a second rail containing a second water-cooling flow of a second cooling path provides cooling for second temperature stable components. The second rail extends from the water-flow inlet to the water-flow outlet of the cooling system. The first rail and the second rail are separate providing separate and independent water-cooling flows. As indicated at block 408, a second interface assembly engaging the second rail and having a selected configuration to engage and cool the second temperature stable components.

As indicated at block 410, a cooling flow control valve rail-splitter can implement dynamic control of water-cooling flows into the cooling system in response to a control input. For example, the inlet cooling flow control valve rail-splitter 120 can dynamically change cooling water-flows into the cooling system 100 in response to a control input, for example provided by computer 501 based on operating temperature.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Referring to FIG. 5, the computing environment 500 contains an example of an environment for the execution of at least some of the computer code involved in performing the inventive methods, such as the Cooling Flow Control 582, and the Cooling-Flow Parameter Data Store 584 at block 580. In addition to block 580, computing environment 500 includes, for example, the computer 501, wide area network (WAN) 502, end user device (EUD) 503, remote server 504, public cloud 505, and private cloud 506. In this embodiment, computer 501 includes processor set 510 (including processing circuitry 520 and cache 521), communication fabric 511, volatile memory 512, persistent storage 513 (including operating system 522 and block 580, as identified above), peripheral device set 514 (including user interface (UI) device set 523, storage 524, and Internet of Things (IoT) sensor set 525), and network module 515. Remote server 504 includes remote database 530. Public cloud 505 includes gateway 540, cloud orchestration module 541, host physical machine set 542, virtual machine set 543, and container set 544.

COMPUTER 501 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 530. As is well understood in the art of computer technology, and depending upon the technology, performance of a computer-implemented method may be distributed among multiple computers and/or between multiple locations. On the other hand, in this presentation of computing environment 500, detailed discussion is focused on a single computer, specifically computer 501, to keep the presentation as simple as possible. Computer 501 may be located in a cloud, even though it is not shown in a cloud in FIG. 5. On the other hand, computer 501 is not required to be in a cloud except to any extent as may be affirmatively indicated.

PROCESSOR SET 510 includes one, or more, computer processors of any type now known or to be developed in the future. Processing circuitry 520 may be distributed over multiple packages, for example, multiple, coordinated integrated circuit chips. Processing circuitry 520 may implement multiple processor threads and/or multiple processor cores. Cache 521 is memory that is located in the processor chip package(s) and is typically used for data or code that should be available for rapid access by the threads or cores running on processor set 510. Cache memories are typically organized into multiple levels depending upon relative proximity to the processing circuitry. Alternatively, some, or all, of the cache for the processor set may be located "off chip." In some computing environments, processor set 510 may be designed for working with qubits and performing quantum computing.

Computer readable program instructions are typically loaded onto computer 501 to cause a series of operational steps to be performed by processor set 510 of computer 501 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 521 and the other storage media discussed below. The program instructions, and associated data, are accessed by processor set 510 to control and direct performance of the inventive methods. In computing environment 500, at least some of the instructions for performing the inventive methods may be stored in block 580 in persistent storage 513.

COMMUNICATION FABRIC 511 is the signal conduction path that allows the various components of computer 501 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 512 is any type of volatile memory now known or to be developed in the future. Examples include dynamic type random access memory (RAM) or static type RAM. Typically, volatile memory 512 is characterized by random access, but this is not required unless affirmatively indicated. In computer 501, the volatile memory 512 is located in a single package and is internal to computer 501, but, alternatively or additionally, the volatile memory may be distributed over multiple packages and/or located externally with respect to computer 501.

PERSISTENT STORAGE 513 is any form of non-volatile storage for computers that is now known or to be developed in the future. The non-volatility of this storage means that the stored data is maintained regardless of whether power is being supplied to computer 501 and/or directly to persistent storage 513. Persistent storage 513 may be a read only memory (ROM), but typically at least a portion of the persistent storage allows writing of data, deletion of data and re-writing of data. Some familiar forms of persistent storage include magnetic disks and solid state storage devices. Operating system 522 may take several forms, such as various known proprietary operating systems or open source Portable Operating System Interface-type operating systems that employ a kernel. The code included in block 580 typically includes at least some of the computer code involved in performing the inventive methods.

PERIPHERAL DEVICE SET 514 includes the set of peripheral devices of computer 501. Data communication connections between the peripheral devices and the other components of computer 501 may be implemented in various ways, such as Bluetooth connections, Near-Field Communication (NFC) connections, connections made by cables (such as universal serial bus (USB) type cables), insertion-type connections (for example, secure digital (SD) card), connections made through local area communication networks and even connections made through wide area networks such as the internet. In various embodiments, UI device set 523 may include components such as a display screen, speaker, microphone, wearable devices (such as goggles and smart watches), keyboard, mouse, printer, touchpad, game controllers, and haptic devices. Storage 524 is external storage, such as an external hard drive, or insertable storage, such as an SD card. Storage 524 may be persistent and/or volatile. In some embodiments, storage 524 may take the form of a quantum computing storage device for storing data in the form of qubits. In embodiments where computer 501 is required to have a large amount of storage (for example, where computer 501 locally stores and manages a large database) then this storage may be provided by peripheral storage devices designed for storing very large amounts of data, such as a storage area network (SAN) that is shared by multiple, geographically distributed computers. IoT sensor set 525 is made up of sensors that can be used in Internet of Things applications. For example, one sensor may be a thermometer and another sensor may be a motion detector.

NETWORK MODULE 515 is the collection of computer software, hardware, and firmware that allows computer 501 to communicate with other computers through WAN 502. Network module 515 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 515 are performed on the same physical hardware device. In other embodiments (for example, embodiments that utilize software-defined networking (SDN)), the control functions and the forwarding functions of network module 515 are performed on physically separate devices, such that the control functions manage several different network hardware devices. Computer readable program instructions for performing the inventive methods can typically be downloaded to computer 501 from an external computer or external storage device through a network adapter card or network interface included in network module 515.

WAN 502 is any wide area network (for example, the internet) capable of communicating computer data over non-local distances by any technology for communicating computer data, now known or to be developed in the future. In some embodiments, the WAN 502 may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 503 is any computer system that is used and controlled by an end user (for example, a customer of an enterprise that operates computer 501), and may take any of the forms discussed above in connection with computer 501. EUD 503 typically receives helpful and useful data from the operations of computer 501. For example, in a hypothetical case where computer 501 is designed to provide a recommendation to an end user, this recommendation would typically be communicated from network module 515 of computer 501 through WAN 502 to EUD 503. In this way, EUD 503 can display, or otherwise present, the recommendation to an end user. In some embodiments, EUD 503 may be a client device, such as thin client, heavy client, mainframe computer, desktop computer and so on.

REMOTE SERVER 504 is any computer system that serves at least some data and/or functionality to computer 501. Remote server 504 may be controlled and used by the same entity that operates computer 501. Remote server 504 represents the machine(s) that collect and store helpful and useful data for use by other computers, such as computer 501. For example, in a hypothetical case where computer 501 is designed and programmed to provide a recommendation based on historical data, then this historical data may be provided to computer 501 from remote database 530 of remote server 504.

PUBLIC CLOUD 505 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economics of scale. The direct and active management of the computing resources of public cloud 505 is performed by the computer hardware and/or software of cloud orchestration module 541. The computing resources provided by public cloud 505 are typically implemented by virtual computing environments that run on various computers making up the computers of host physical machine set 542, which is the universe of physical computers in and/or available to public cloud 505. The virtual computing environments (VCEs) typically take the form of virtual machines from virtual machine set 543 and/or containers from container set 544. It is understood that these VCEs may be stored as images and may be transferred among and between the various physical machine hosts, either as images or after instantiation of the VCE. Cloud orchestration module 541 manages the transfer and storage of images, deploys new instantiations of VCEs and manages active instantiations of VCE deployments. Gateway 540 is the collection of computer software, hardware, and firmware that allows public cloud 505 to communicate through WAN 502.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 506 is similar to public cloud 505, except that the computing resources are only available for use by a single enterprise. While private cloud 506 is depicted as being in communication with WAN 502, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 505 and private cloud 506 are both part of a larger hybrid cloud.

While the foregoing is directed to embodiments of the present invention, other and further embodiments of the invention may be devised without departing from the basic scope thereof, and the scope thereof is determined by the claims that follow.

What is claimed is:

1. A cooling system comprising:
   a first rail containing a first water-cooling flow of a first cooling path to cool first power fluctuating components; the first rail extending from a water-flow inlet to a water-flow outlet of the cooling system;
   a first interface assembly engaging the first rail and having a selected configuration to engage and cool the first power fluctuating components;
   a second rail containing a second water-cooling flow of a second cooling path to cool second temperature stable components, the second rail extending from the water-flow inlet to the water-flow outlet of the cooling system, wherein the first rail and the second rail are separate, and wherein the first cooling path and second cooling path include separate and independent water-cooling flows; and
   a second interface assembly engaging the second rail and having a selected configuration to engage and cool the second temperature stable components.

2. The cooling system of claim 1, wherein the first rail and the second rail comprise a unitary water conduit.

3. The cooling system of claim 1, wherein the first rail and the second rail are formed of a high thermal conductive material.

4. The cooling system of claim 1, wherein the first rail and the second rail comprise a water conduit formed of a Copper material.

5. The cooling system of claim 1, wherein the first interface assembly comprises at least one of a heat spreader member, a circuit card supporting member, or an cooling assembly latching member.

6. The cooling system of claim 1, further comprises a circuit board supporting the first power fluctuating components, and wherein the first interface assembly comprises a heat spreader member configured with an elongated portion disposed in cooling engagement with the circuit board.

7. The cooling system of claim 6, wherein the heat spreader member is configured with an attaching point for attachment to the first rail.

8. The cooling system of claim 6, wherein the heat spreader member has a geometry to support heat load of the circuit board and further comprises at least one of a cast and formed member, or an extruded and machined member.

9. The cooling system of claim 6, wherein the first interface assembly comprises a Thermal Interface Material (TIM) disposed between the heat spreader member and the circuit board.

10. The cooling system of claim 1, further comprises a circuit board supporting the second temperature stable components, and wherein the second interface assembly comprises a pair of heat spreader members, the heat spreader members disposed on opposite sides of the circuit board.

11. The cooling system of claim 10, wherein the second interface assembly comprises a Thermal Interface Material (TIM) disposed between circuit board and the heat spreader members.

12. The cooling system of claim 10, wherein the heat spreader members comprise stamped and formed members.

13. The cooling system of claim 10, wherein the heat spreader members are formed of an Aluminum material having a high thermal conductivity.

14. The cooling system of claim 1, wherein the first rail and the first interface assembly provide a higher cooling capacity than the second rail and the second interface assembly.

15. The cooling system of claim 1, further comprising an inlet cooling flow control valve rail-splitter providing a first cooling water flow from the water inlet to the first rail and providing a second cooling water flow from the water inlet to the second rail.

16. The cooling system of claim 15, wherein the inlet cooling flow control valve rail-splitter includes a first orifice size to the first rail and a second orifice size to the second rail, the first orifice size is larger than the second orifice size to restrict the second cooling water flow.

17. A cooling method comprising:
   providing a first rail containing a first water-cooling flow of a first cooling path to cool first power fluctuating components; wherein the first rail extends from a water-flow inlet to a water-flow outlet of a cooling system;
   providing a first interface assembly engaging the first rail and having a selected configuration to engage and cool the first power fluctuating components;
   providing a second rail containing a second water-cooling flow of a second cooling path to cool second temperature stable components, wherein the second rail extends from the water-flow inlet to the water-flow outlet of the cooling system, and wherein the first rail and the second rail are separate to provide separate and independent water-cooling flows for the first cooling path and second cooling path; and
   providing a second interface assembly engaging the second rail and having a selected configuration to engage and cool the second temperature stable components;
   providing a flow control valve rail-splitter to dynamically control the water-cooling flows in response to a control input.

18. The method of claim 17, wherein providing the first rail and the second rail comprise providing a separate unitary water conduit to implement the first rail and the second rail, the unitary water conduits are formed of a thermal conductive material.

19. The method of claim 17, wherein providing the first interface assembly further comprises providing a circuit board supporting the first power fluctuating components, and providing a heat spreader member configured with an elongated portion in cooling engagement with the circuit board.

20. The method of claim 17, wherein providing the second interface assembly further comprises providing a circuit board supporting the second temperature stable components, and providing a pair of heat spreader members disposed on opposite sides of the circuit board in cooling engagement with the circuit board.

* * * * *